United States Patent [19]

Hoenninger, III et al.

[11] Patent Number: 4,707,661

[45] Date of Patent: Nov. 17, 1987

[54] MACHINE GENERATION OF MACHINE-EXECUTABLE STATE-CHANGE INSTRUCTIONS FOR MAGNETIC RESONANCE IMAGING

[75] Inventors: John C. Hoenninger, III, Oakland; Lawrence E. Crooks, Richmond, both of Calif.

[73] Assignee: The Regents of the University of California, Berkeley, Calif.

[21] Appl. No.: 890,364

[22] Filed: Jul. 29, 1986

[51] Int. Cl.⁴ ............................................ G01R 33/20
[52] U.S. Cl. ..................................... 324/309; 364/414
[58] Field of Search ................. 324/309, 312; 364/414

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,471,305 | 9/1984 | Crooks et al. | 324/309 |
| 4,599,565 | 7/1986 | Hoenninger, III et al. | 324/309 |

FOREIGN PATENT DOCUMENTS

| | | | |
|---|---|---|---|
| 109633 | 5/1984 | European Pat. Off. | 324/309 |
| 2126731 | 3/1984 | United Kingdom | 324/309 |

OTHER PUBLICATIONS

"Digital Integration of Nuclear Magnetic Resonance (NMR) Spectra In Real Time"; *Instrum. & Exp. Tech.;* vol. 14, No. 2, pp. 516-518; Apr. 1971; Yu. D. Neechaev et al.

"NMR Fourier Zeugmatography"; *Journal of Magnetic Resonance;* issue 18 (1975), pp. 69-83; Anil Kumor et al.

"Instrumentation for NMR Spin-Warp Imaging"; J. Phys., E: *Sci. Instrum.,* vol. 15, No. 1, Jan. 1982; pp. 74-79; G. Johnson et al.

*Primary Examiner*—Tom Noland
*Attorney, Agent, or Firm*—Nixon & Vanderhye

[57] ABSTRACT

An assembler/linker process utilizes predetermined control program segments ("templates" defining a subsequence of magnetic resonance imaging (MRI) states) together with predetermined program-change tables of MRI parameter values. At least some of the program segments are referenced by predetermined symbolic addresses and include pointer-references to corresponding ones of the table entries. The assembler/linker process machine replicates a predetermined set of such slice/specific program segments in a predetermined order while also simultaneously indexing corresponding symbolic addresses and referenced table entries in a predetermined sequence so as to maintain proper correspondence between slice-specific main programs and subroutines for each replicated program segment. In addition, certain of the replicated program segments may be defined having predetermined symbolic addresses which are not indexed thus further conserving the number of program instructions which need to be replicated and stored in the assembly/linkage process. A subset of slice-specific program segments can be further designated for replication as a unit before following program segments are utilized. A unique linker language level syntax is also provided for an ordered string of input digital data used to control the assembler/linker replication process.

6 Claims, 8 Drawing Figures

FIG. 1
(PRIOR ART)

EXEMPLARY CYCLE TIME SEQUENCE
FOR 2D FT IMAGING OF SINGLE SLICE

P10 (PROGRAM SEGMENT NO. 10)

*ALL ARE OFF UNLESS OTHERWISE INDICATED*

| LINE | SYMBOLIC ADDRESS | INSTRUCTION | JMP SYMBOLIC ADDRESS | JMP LIMIT | TIME SCALE | STOP | XGRAD | YGRAD | ZGRAD | FREQ | WGEN | RF ON | PH 1 | PH 0 | TX SW | RC GATE | SAMPLE | TEST | SCOPE | WAIT |
|---|---|---|---|---|---|---|---|---|---|---|---|---|---|---|---|---|---|---|---|---|
| 1 | A | BNE1 | AA | 0 | 4,500 μs | OFF | 0 | 0 | T1 | 000 | | | | | ON | | | | | |
| 2 | | CONT | | 0 | 500 | OFF | 0 | 0 | T1 | 000 A | | ON | | | ON | | | | | |
| 3 | | JMP | AB | 0 | 5,120 | OFF | 0 | 0 | T1 | 000 | | ON | ON | | ON | | | | | |
| 4 | AA | CONT | | 0 | 500 | OFF | 0 | 0 | T1 | 000 | | ON | ON | | ON | | | | | |
| 5 | | CONT | | 0 | 5,120 | OFF | 0 | 0 | T1 | 000 A | | | | | | | | | | |
| 6 | AB | CONT | | 0 | 4,880 | OFF | T6 | T31 | T2 | 000 | | | | | | | | | | |
| 7 | | CONT | | 0 | 500 | OFF | 0 | 0 | 0 | 000 | | | | | | | | | | |
| 8 | | BNE2 | AC | 0 | 3,000 | OFF | 0 | 0 | T3 | 000 | | ON | | | | | | | | |
| 9 | | CONT | | 0 | 500 | OFF | 0 | 0 | T3 | 000 | | ON | ON | ON | ON | | | | | |
| 10 | | JMP | AD | 0 | 5,120 | OFF | 0 | 0 | T3 | 000 B | | ON | ON | ON | ON | | | | | |
| 11 | AC | CONT | | 0 | 500 | OFF | 0 | 0 | T3 | 000 | | ON | ON | ON | ON | | | | | |
| 12 | | CONT | | 0 | 5,120 | OFF | 0 | 0 | T3 | 000 B | | ON | ON | ON | ON | | | | | |

96 BITS OF MICRODE PER LINE OF ASSEMBLY LEVEL CODE

606 — Load lines of code into Load Buffer with insertion of absolute addresses for symbolic and indexed-symbolic addresses (from symbol table; add Main program base address to main program relative addresses in the symbol table) and look-up and insertion of PCT values as specified. Slice type PCTs use Svalue index to look-up entry and cycle type PCTs use internal pointer. Increment Address counter after each line.

End of Mainlist ? — N → (C)

Y ↓

Increment internal pointers of cycle type PCTs.

Cycle counter = Cycle counter + 1

Cycle counter .GREATER. last cycle ? — N → (D)

Y ↓

614 — Insert microcode instruction with 'Stop' bit on

616 — Load and start the sequencer

MACHINE GENERATION OF MACHINE-EXECUTABLE STATE-CHANGE INSTRUCTIONS FOR MAGNETIC RESONANCE IMAGING

This invention generally relates to automatic machine control of magnetic resonance imaging (MRI) processes. In particular, it is related to a process for machine generating machine-executable state-change instructions for the sequence controller of a multi-slice magnetic resonance imaging system.

CROSS REFERENCES TO RELATED APPLICATIONS

Magnetic resonance imaging systems of several different types are now commercially available. One exemplary type of such system is described in commonly assigned U.S. Pat. Nos. 4,297,637—Crooks et al, 4,318,043—Crooks et al, 4,471,305—Crooks et al and pending application Ser. No. 515,117—Hoenninger et al and now U.S. Pat. No. 4,599,565. The content of each of these related commonly assigned documents is hereby incorporated by reference.

BACKGROUND OF THE INVENTION

As those in the art will appreciate, a magnetic resonance imaging system may be considered as a state machine where, at any given instant, the machine resides in a predetermined one of a finite set of possible states. For example, in the exemplary embodiment, a single spin echo data gathering sequence may involve the generation of successive 90° and 180° RF "flip" of nutation pulses in conjunction with a specific sequence of switched x, y, z coordinate magnetic gradients (superimposed on a static z-axis magnetic field) coupled with the sampled measurement of RF spin echo responses. As will be explained in more detail below, such a sequence of events actually comprises a succession of distinct machine states for the MRI system. In the exemplary embodiment, a conventional sequence controller is utilized so as to provide proper sequence control of waveform generators, RF transmitters and receivers, magnetic gradient amplifiers, analog-to-digital sampling circuits, and the like. After a complex iteration of what may comprise a sequence of thousands of distinct machine states, sufficient digital data may be accumulated to permit the calculation of a digitized image for one or more "slices" of an object (e.g., a human body or a portion thereof) under test.

Typically, the detailed design of a specific imaging sequence requires a comprehensive and accurate understanding of the MRI process which is possessed by a relatively few high-level experienced persons whose available time and patience for such voluminous and detailed programming chores becomes burdensome and expensive. In some ways, the generalized problem is analogous to that presented much earlier in the art of computer programming generally. There, it was noted that certain subsets or segments of machine language program instructions were continually being repeated whenever it was necessary to perform a common task. Accordingly, to expedite the computer programming process, higher level languages were devised and utilized with a pre-defined syntax to generate input to so-called "assembler" or "compiler" programs which, in turn, machine generated the machine level object code for execution by a CPU so as to effect an application program defined by the sequence of higher level (e.g., assembly or compiler input) language statements.

When presented with the problem of programming the sequence controller for an MRI system, it was also earlier noted that certain segments of program steps tend to be repeated when performing common tasks. Accordingly, in a manner analogous to that employed for generating computer programs in general, a specialized assembly level language has been used in the past for generating the necessary sequence of machine executable instructions for the MRI sequence controller.

However, even utilizing such prior techniques, it has typically still been necessary (especially for multi-slice sequences) for a relatively high level human "programmer" to design relatively long detailed sets of program statements which include subsets of nearly identical statements (but including important subtle changes). Not only does this require the expenditure of a rather large human programming effort, it also often requires additional program memory. And then when one wants to change the program so as to achieve a different imaging procedure, the generation of the required new program can be quite tedious and time consuming.

SUMMARY OF THE INVENTION

We have now discovered a method for substantially simplifying the required human programming effort while also optimizing program memory requirements. In brief summary, our technique involves the definition of predetermined slice-specific program segments of machine executable MRI sequencer instructions referenced by predetermined respective symbolic addresses and also including pointer-references to predetermined "program change tables" of MRI parameter values. A predetermined set of such slice-specific program segments may then be conveniently machine replicated in a predetermined order while simultaneously indexing corresponding symbolic addresses and referenced table entries so as to maintain proper correspondence between slice-specific main programs and slice-specific sub-routines for each replicated program segment. In the preferred exemplary embodiment, some program segments (e.g., those which are not slice specific) have predetermined symbolic addresses which are specially treated by not indexing them during the replication procedure.

In the exemplary embodiment, the machine replicating step (i.e., the assembler/linker program) is controlled by an ordered string of input digital data (linker level statements) of the following format:

P3(P4:6)S20P7/P10(P14)S1:20P15P16;C1:256 wherein
- Pn=symbols representing predetermined program segments n;
- /=a symbol representing separation between subroutines and main programs;
- (X)SY=slice-specific designation symbols identifying slice-specific program segments X to be replicated for slices Y;
- ;=a symbol designating the end of a string of associated entities such as program segments; and
- C1:256=symbols associated with an entire sequence of program segments to be replicated which specifies the range of successive phase-encoding cycles.

In addition, the ordered string of input digital data (i.e., the input "statement") in the exemplary embodiment may include: (1) a further symbol designating a subset of slice-specific program segments which are to be replicated as a unit before the following program segment(s) is (are) utilized, and (2) a symbol designating which level of a set of program change tables are to be utilized during the replication process.

BRIEF DESCRIPTION OF THE DRAWINGS

These as well as other objects and advantages of this invention will be more completely understood and appreciated by carefully reading the following detailed description of a presently preferred exemplary embodiment when taken in conjunction with the accompanying drawings, of which.

DESCRIPTION OF THE PREFERRED EMBODIMENTS

Figure 1:
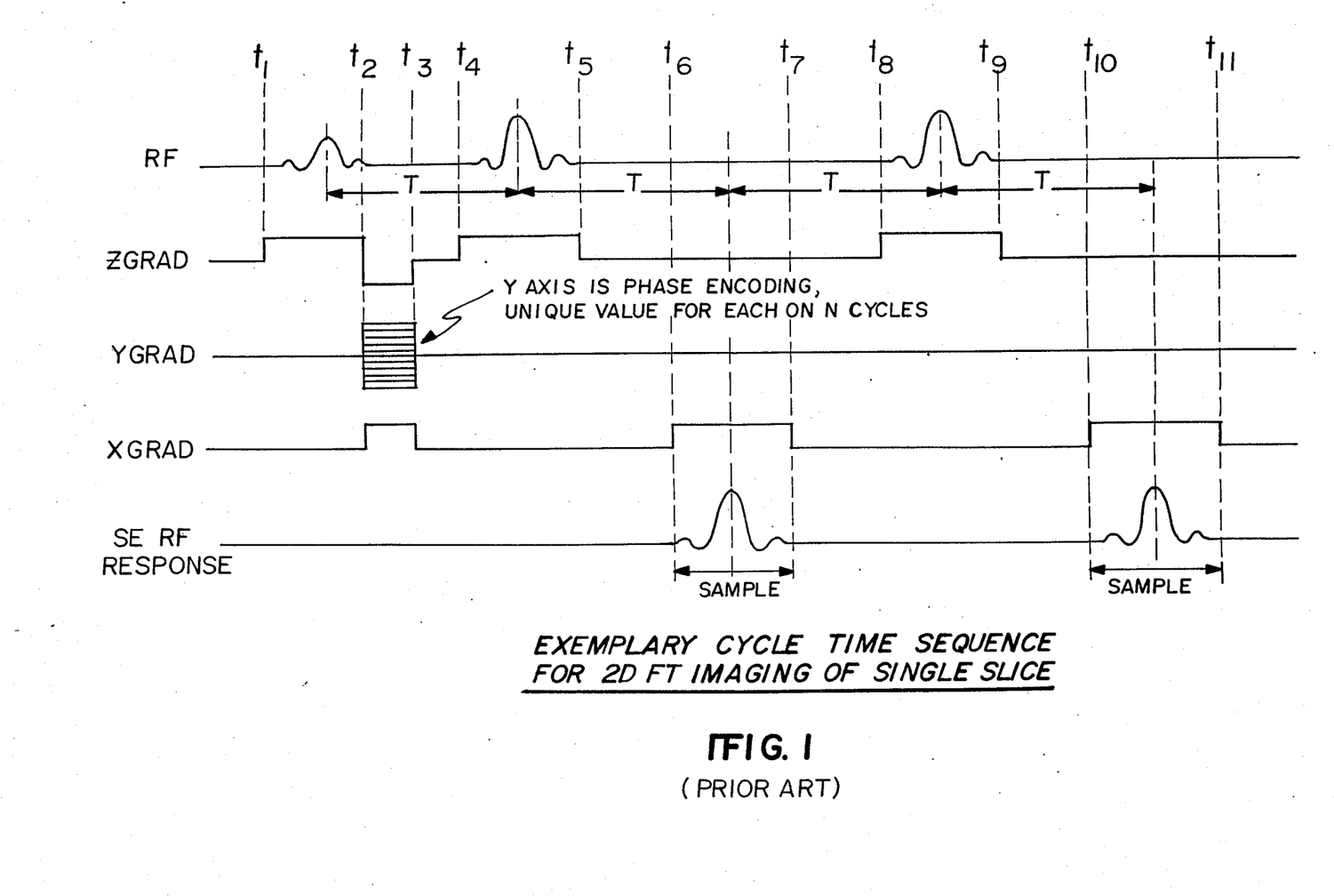
FIG. 1 is a time domain diagram of an exemplary sub-cycle-time sequence for a two-dimensional Fourier Transform (i.e., 2DFT) MRI measurement involving a single "slice" of an object to be imaged.

Those in the art will recognize that a typical MRI sequence controller permits one to define an essentially arbitrary sequence of machine states for a given MRI system as may be desired and/or required to achieve a specific MRI measurement sequence. The simplified exemplary sub-cycle-time sequence for two-dimensional Fourier Transformation imaging of a single slice is depicted in FIG. 1 and is of the type generally known in the prior art. The state changes which occur at times $t_1$ through $t_{11}$ are explictly depicted in FIG. 1 and in the flowchart description of FIG. 2. For example, at time $t_1$ the RF waveform generator is switched "on" in a state which will generate a sinc-shaped envelope of RF signals. The frequency of these RF signals in conjunction with the magnitude of z-axis gradient (also switched "on" at time $t_1$) will "select" a specific relatively thin "slice" of an object under test for MRI measurements in accordance with known NMR principles.

At time $t_2$, the RF waveform generator is turned "off" while the z-gradient current amplifier is reversed in polarity (so as to achieve a known type of re-phasing correction) while the y-gradient driver is turned "on" to a predetermined phase encoding value and the x-gradient driver is also turned "on" (again to effect a known type of re-phasing correction). At time $t_3$, all of the gradient drivers are turned off and the system is permitted to "coast" until time $t_4$ whereupon the slice-selective z-gradient is again turned on and the RF waveform generator is caused to generate a 180° RF flipping or nuclei nutation pulse (again at the proper slice-selective frequency). In accordance with the well-known "rule of equal times," a spin echo signal can be expected between times $t_6$ and $t_7$ during which the read-out x-gradient is applied so as to achieve phase encoding along the x-axis dimension. If desired, a further spin echo can be elicited as depicted in FIG. 1 by providing an additional 180° RF pulse to the same selected slice in accordance with the rule of equal times. As explained in the above referenced related patents, the spin echo r.f. response signal is typically sampled and digitized to provide the raw measured NMR imaging data which is accumulated and subsequently processed into an NMR image of the selected "slice" region" (using known techniques).

Figure 2:
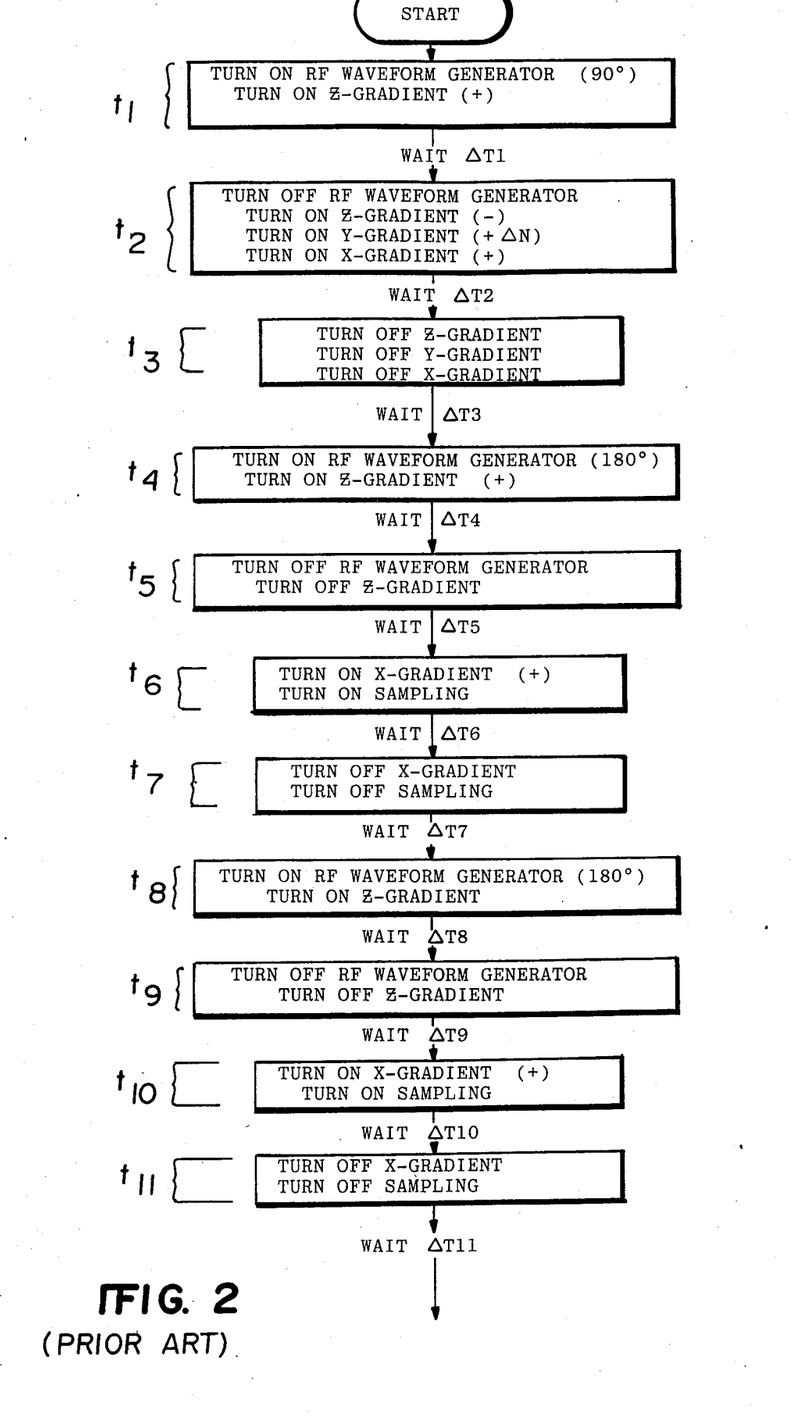
FIG. 2 is a state change flowchart diagram depicting the eleven MRI sequence controller state changes required to implement the time domain MRI sequence of FIG. 1.

As may be appreciated by observing FIGS. 1 and 2, the MRI system can be thought of as being controlled to take on a given state at a discrete time and then maintaining that state for a predetermined time interval until the next state occurs.

Where multiple slices are to be imaged, significant time savings can be achieved by performing sequences such as depicted in FIGS. 1 and 2 in rapid succession for different slices during a single T1 NMR interval. (It will be understood by those in the art that one must wait several T1 intervals (or at least a major fraction of such interval) before repeating a measurement sequence such as that shown in FIG. 1 for the same slice so as to permit the NMR nuclei to become realigned with the static Z-axis magnetic field before being re-excited to NMR.) The sequence for the same slice would be repeated many different times using a succession of different y-gradient phase encoding values (e.g., 128 or 256). In addition, the measurement sequence of FIG. 1 may be repeated several times for the same y-axis phase encoding value if spin echo signal averaging or other signal-to-noise enhancing techniques are employed.

Figure 3:
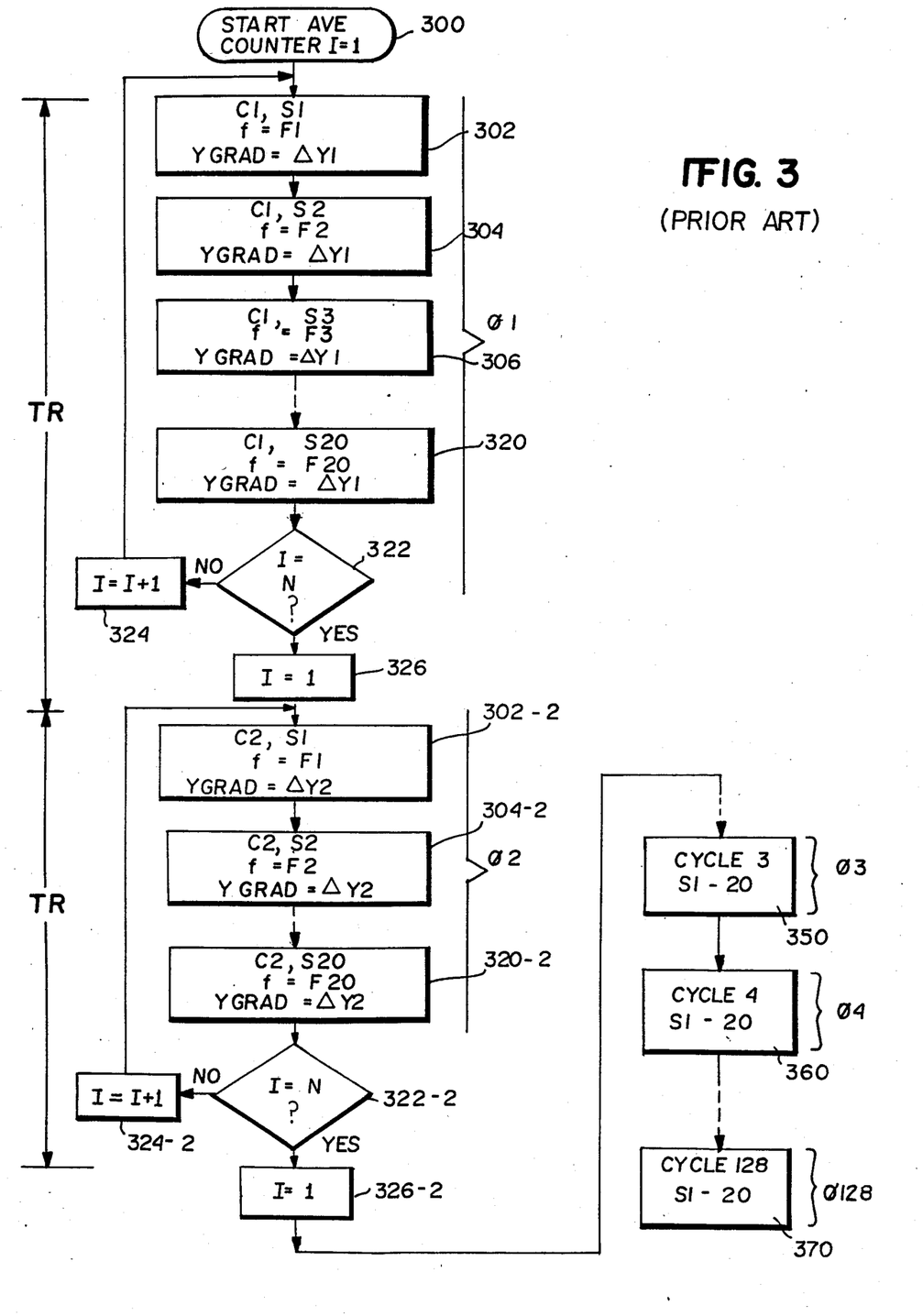
FIG. 3 is a flowchart depiction of a typical sequence of machine executable instructions which must in one fashion or another be assembled and executed so as to achieve the exemplary MRI sequence.

The result may be a very long sequence of detailed programmed machine state changes such as is depicted in a very abbreviated flowchart form at FIG. 3. Assuming that a plurality of spin echo responses are to be averaged (which is not always the case), one straightforward way to program the necessary sequence of controller states is as depicted in FIG. 3. Here, an average counter might be reset to a content of 1 at start block 300 before a 1-slice cycle of states (e.g., as depicted in FIG. 2) is implemented at block 302. Here, the nomenclaure "C1, S1" indicates that this is cycle 1 (e.g., a y-gradient phase encoding value of $\phi 1$) for slice No. 1 (a specific relatively thin planar volume taken at some specific spatial location through the object to be imaged). The notation of frequency simply confirms the fact that this variable is chosen so as to choose the desired slice #1 and the depiction of the y-gradient value is simply representative of the y-axis phase encoding value $\phi 1$ which is utilized throughout cycle 1.

The entire set of states is replicated at block 304 with appropriate changes so as to now affect a second slice during this second segment or sub-set of the first cycle. Similarly, the entire block of states is again essentially replicated at block 306 for the third slice and so on through block 320 for the 20th slice in this exemplary embodiment (where it is assumed that 20 slices are being simultaneously imaged). A test for the average counter contents is conducted at 322 and, unless a sufficient number of data have already been accumulated, the average counter is incremented at 324 and control is returned to the beginning of cycle 1 at block 302. The time required to traverse once through blocks 302 through 320 is approximately equal to the repetition interval imaging parameter TR as depicted in FIG. 3.

As may be appreciated, the state sequences in blocks 302 through 320 are essentially identical except for changes associated with the selection of different slices (e.g., the RF frequency parameter) which must be changed for each subcycle block of sequential states in cycle 1.

Once cycle 1 has been completed, the average counter (if used) may be reset at 326 and a second cycle associated with phase $\phi 2$ is then entered comprising blocks 302-2 through 320-2 and including similar average counter test blocks 322-2 and incrementing functions 324-2. Now, the y-gradient or y-axis phasing encoding value has been changed so as to represent phase $\phi 2$ and, as before, the slice-selective parameters must be changed from one block to the next within cycle 2. In a similar manner, cycles 3 (block 350) cycle 4 (block 360) through the Nth cycle (e.g., cycle 128 at block 370) must in some manner be generated in the correct sequence and processed by the MRI sequence controller so as to achieve the desired MRI data. Since there are typically at least 128 and often 256 cycles to encode, each of which typically may involve as many as 20 or so individual slices, each of which slices may itself involve a rather complex sequence of states as depicted in FIG. 2, it can be seen that a straightforward line-by-line coding of such a sequence can become exceedingly time consuming. Furthermore, the opportunity for errors in such a tedious and time consuming task is greatly multiplied.

In the exemplary embodiment (using a commercially available MRI system available from Diasonics Corporation) the state of the sequence controller is uniquely defined by a 96 bit word of "microcode." Each such 96 bit word of microcode is, in turn, uniquely defined by a single line or statement of an assembly level language program. When the sequencer executes a given instruction line (i.e., 96 bits of microcode), it outputs the values of the parameters contained in gradient fields associated with that instruction for a particular time lapse (specified in the time field of the instruction) provided that the "wait" bit is not "on." If the wait bit is "on", then any lapse time value associated with the instruction is ignored and the instruction output persists until some external gating signal to the sequencer is supplied (e.g., by a transition from low to high value). Thus, when the lapse time expires or, alternatively, if the wait bit is "on" when the external gating signal occurs, then the next instruction in a provided sequence of such instructions is executed by the sequencer.

To provide some assistance in understanding the exemplary embodiment, some of the assembly language instruction set will now be briefly explained:

CONT: Continue Instruction

The Continue instruction provides output values for the specified time and instructs the sequencer to execute the next successive instruction.

JMP: Jump Instruction

The Jump instruction provides output values for the specified time and instructs the Sequencer that the next instruction to execute is the instruction with the same assigned address Symbol as the Jump Symbol (Jmp Sym) argument of the Jump instruction.

JSR: Jump Subroutine

The Jump Subroutine instruction provides output values for the specified time and instructs the Sequencer that the next instruction to execute is the instruction with the same assigned address symbol as the Jump Symbol (Jmp Sym) argument of the Jump subroutine instruction. In addition, it saves the address of the instruction immediately following the jump Subroutine so that on completion of the subroutine, execution of the calling program can continue. The address is saved on a stack which holds four addresses. One can thus call a subroutine from a subroutine in nested fashion four times. If more than four deep nesting is attempted (more than four JSRs occur before a RTS is encountered) the program will, without warning, execute in an unexpected order.

RTS: Return from Subroutine (or Return to Source)

The Return from Subroutine instruction provides output values for the specified time and instructs the Sequencer to pop an address off the top of the stack and execute the instruction at this address as the next instruction. This allows the subroutine to return control to the calling program at the instruction following the call to the subroutine. The stack is popped up each time a RTS is executed. If a RTS occurs without being called by a JSR the program will, without warning, execute in an unexpected order.

BNE: Branch Not Equal 1-3

The Branch Not Equal instruction provides output values for the specified time and decides whether to continue or jump to another instruction based on a comparison of a Loop Counter with the Jump Count field. Note that the first counter (BNE1) can have values of 0-31, while counters 2 and 3 (BNE2 and BNE3) have a range of 0-15. The counter value is not changed by the BNE instructions. If the counter is not equal to the Jump Count the next instruction to execute is the instruction with the same Symbol as the Jump Symbol (Jmp Sym) of the BNE instruction. If the counter is equal to the Jump Count, execution continues with the following instruction.

BRC: Branch Conditional 1-3

The Branch Conditional instruction provides output values for the specified time and decides whether to continue or jump to another instruction based on a comparison of the Loop Counter with the Jump Count field. It also increments the counter and resets it if the condition is equal. Note that the first counter (BRC1) can test values of 1-31, while counters 2 and 3 (BRC2 and BRC3) test a range of 1-15. The counter value is incremented by one before it is tested. If the counter is not equal to the Jump Count the next instruction to execute is the instruction with the same Symbol as the Jump Symbol (Jmp Sym) argument of the BRC instruction. If the counter is equal to the Jump Count, the counter is reset (set to 0) and execution continues with the following instruction.

The Loop Counters all start with value zero when the Sequencer is loaded.

In the exemplary embodiment, the program is broken into so-called "program segments" identified by a designation "Pn" where n represents an assigned numerical identifier for a particular program segment. A partial example of program segment No. 10 is depicted, for example, at FIG. 4. Here, the first line of program segment P10 is assigned a symbolic address A. It comprises an instruction BNE1 and includes a jump symbolic address AA (referring, for example to line number 4 of program segment P10) and a jump limit parameter value of $\phi$. The first line of program segment P10 also includes a lapse time parameter value of 4,500 microseconds and an indication that the "stop" bit is "off" (the stop bit would only be set "on" at the end of an entire sequence when a complete set of data gathering cycles have been completed). Parameter values (e.g., data to be used in setting the output current level from a digitally controlled current driving amplifier) are specified for each of the x, y and z-gradient fields. It will be noted that the parameter value for the z-gradient in line one of FIG. 4 has been designated by a pointer reference to Program Change Table 1 (T1) and the significance of this approach will be explained in more detail below. The commanded deviation of the frequency synthesizer from a nominal center value (which center value is typically set to a constant value for an entire measurement sequence) is also included as are on/off bits determining the status of the RF the phasing of the RF signals being generated, the status of the transmit/receive switch as well as various gates, sample, test, scope ports and the earlier described "wait" bit. In the exemplary embodiment, the RF waveform generator status is determined by a two-bit field so as to be capable of desginating different types of waveforms (e.g., a 90° flip angle or a 180° flip angle, etc.) having a predetermined relative phases.

Figure 4:
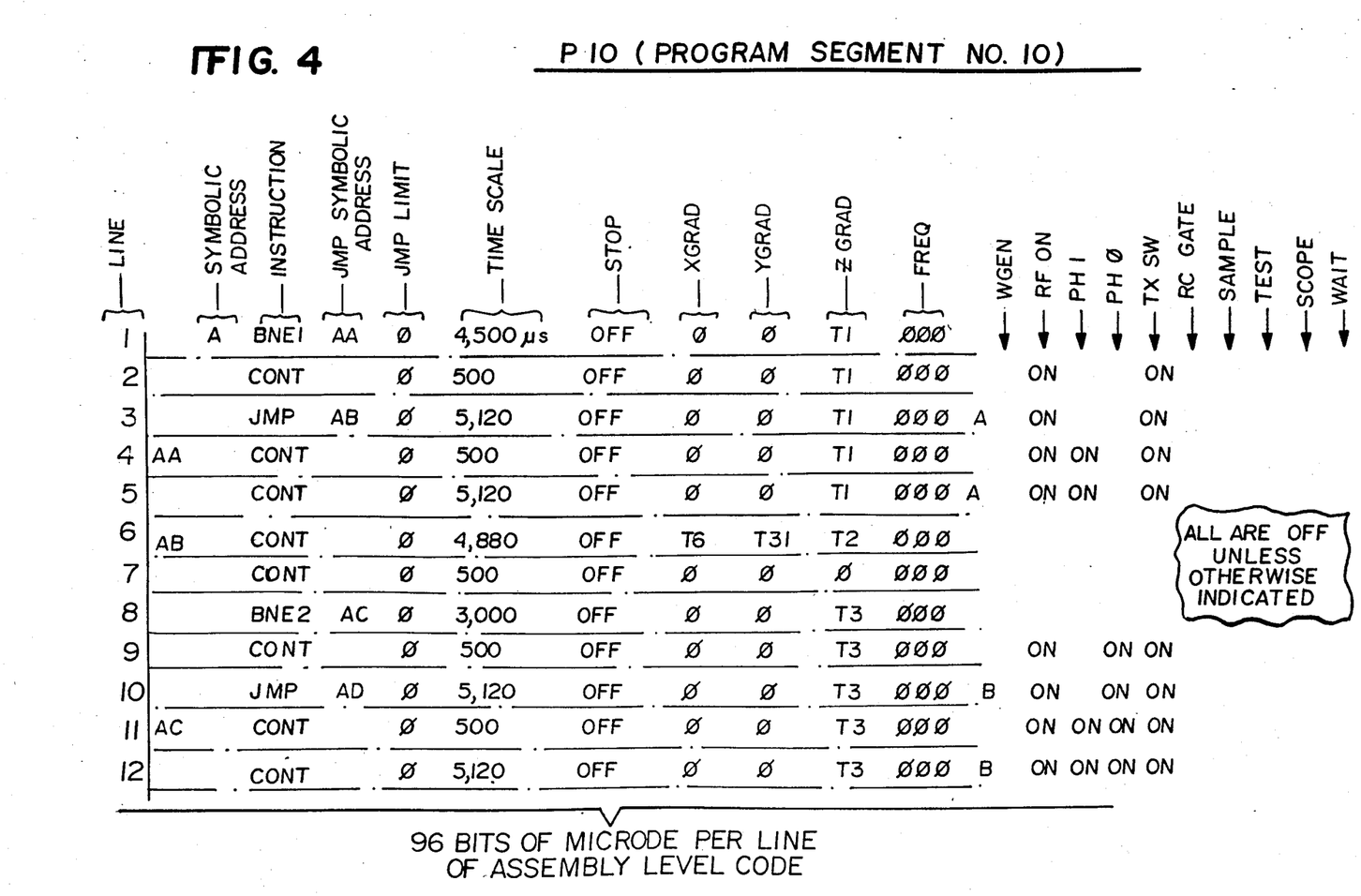
FIG. 4 is a graphic depiction of an exemplary program segment in the exemplary embodiment.

Altogether, the content of a single line of each program segment such as line one in FIG. 4 contains sufficient data to uniquely define a 96 bit word of microcode which, in turn, when executed by the MRI sequence controller, uniquely defines the state of the MRI system during the specified lapse time interval.

The program segment P10 of FIG. 4 may also be thought of as a program "template" in that the parameter values utilized in lieu of the reference pointers to tables of parameter values can be varied for different execution passes. Alternatively, the table may have but a single value located in it and still be useful in that it permits one to easily change a parameter value commonly used many places in the program simply by changing the content of the single entry table (e.g., T1 in FIG. 4 is an example of such a single entry table).

On the other hand, the table may have a great number of successive entries with a counter (software or hardware) being utilized to extract a different successive value from the table for each execution pass of a given program segment. For example, in the exemplary embodiment the y-gradient field must be changed through 128 values during 128 successive cycles of sequencer operation in a given data gathering operation. Preferably (for reasons not here material), the y-gradient will start with a zero value and then increase towards its maximum absolute value with alternating polarity and incremented values such as depicted in the following table of 128 values for the Program Change Table (PCT) T31 of FIG. 4:

TABLE I

PCT 31

| Table Index | YGRD | | | | | | | |
|---|---|---|---|---|---|---|---|---|
| 1 | 0 | −9 | 9 | −18 | 18 | −27 | 27 | −36 |
| 9 | 36 | −45 | 45 | −54 | 54 | −63 | 63 | −72 |
| 17 | 72 | −81 | 81 | −90 | 90 | −99 | 99 | −108 |
| 25 | 108 | −117 | 117 | −126 | 126 | −135 | 135 | −144 |
| 33 | 144 | −153 | 153 | −162 | 162 | −171 | 171 | −180 |
| 41 | 180 | −189 | 189 | −198 | 198 | −207 | 207 | −216 |
| 49 | 216 | −225 | 225 | −234 | 234 | −243 | 243 | −152 |
| 57 | 252 | −261 | 261 | −270 | 270 | −279 | 279 | −288 |
| 65 | 288 | −297 | 297 | −306 | 306 | −315 | 315 | −324 |
| 73 | 324 | −333 | 333 | −342 | 342 | −351 | 351 | −360 |
| 81 | 360 | −369 | 369 | −378 | 378 | −387 | 387 | −396 |
| 89 | 396 | −404 | 405 | −414 | 414 | −423 | 423 | −432 |
| 97 | 432 | −441 | 441 | −450 | 450 | −459 | 459 | −468 |
| 105 | 468 | −477 | 477 | −486 | 486 | −495 | 495 | −504 |
| 113 | 504 | −513 | 513 | −522 | 522 | −531 | 531 | −540 |
| 121 | 540 | −549 | 549 | −558 | 558 | −567 | 567 | −576 |

The use of such tables combined with a unique technique for grouping and replicating program segments as subroutines with indexed symbolic addresses in accordance with this invention can greatly reduce the number of lines of microcode which must be written for a typical MRI sequence. For example, the number of lines of code required may typically be reduced by as much as 60% or more for a 20 slice imaging sequence—while producing exactly the same actual time domain sequence of machine states. Furthermore, the technique of this invention is not limited to a particular type of MRI sequencer since it relies upon an optimal decomposition of MRI sequences into program code templates (e.g., program segments) which encode the unique sequence of machine states required for only one set of spin echos for one slice. The code templates are then logically associated with program change tables (PCT) comprising lists of parameter values which may then be arbitrarily specified for any field in a line of microcode. This association permits a multiplicity of template implementations to be generated in a completely predictable way. Furthermore, the list association with a given microcode field may be performed entirely with software (as in the exemplary embodiment) such that changes to and additions of lists can be easily accomplished.

As previously mentioned, the actual microcode template is defined with program segments written in assembly language as depicted in FIG. 4. Those parameter fields occuring in each line of such assembly language code (and which require list association) contain a specific pointer or reference to a specific parameter table (which pointers may be efficiently organized with a Table Manager Utility as a part of the assembler program, as will be appreciated).

Furthermore, compact assembly language representation is greatly facilitated by the use of subroutines which, in the exemplary embodiment, may be supported in a nested fashion up to four levels. However, in accordance with this invention certain of those subroutines may be specified to be totally independent of all list or table associations so as to reduce further the number of microcode lines produced during the assembly/linkage operation. Using the techniques of this invention, once the program segments or templates for a single slice have been written and the required parameter table values have been entered, the linker/loader program may be controlled by an ordered string of input digital data having an unique syntax so as to properly replicate the program segments or templates in the appropriate sequence, with appropriately changed parameter values and appropriately indexed addresses so as to machine-create the required lengthy set of microcode actually executed by the MRI sequence controller.

Syntax of the input data string (i.e., linker "statement") controlling the linker program has been created specifically to support the needs of a multi-slice MRI sequencer. Furthermore, the concept of list association (i.e., program change tables) is built into the syntax in such a way as to provide the most succinct expression of encoding required for a particular multi-slice sequence. For example, two basic types of lists may be implicit in the structure of the syntax. The first type of list or program change table is of the "slice-specific" type which typically, but not necessarily, provides values for frequency offset parameter fields uniquely associated with each individual slice. The second type of list is typically one containing cycle-dependent parameter values required to specify a slightly different y-gradient pulse magnetic field so as to phase encode a set of spin echos appropriately for each "projection" data set required for FFT image reconstruction.

The linker language syntax permits program segments to be grouped together when they are slice-specific while providing notation for specifying particular list entries and their order of use from a slice-specific list. Program segments or templates may also be grouped in such a way as to provide subgroups of slice-specific segments which may be encoded separately so as to allow subsets of slices to be acquired, rather than requiring all slices to be acquired before one may be repeated (this particular syntax is useful for inversion recovery sequences as may be appreciated by those in the art). The linker language syntax also provides notation for specifying the range of list entries to be used for the second or cycle-dependent type of list over all of the program segments required for a multi-slice imaging sequence (i.e. values to be used for a required set of phase encoded projections in FFT image reconstruction). In addition, the linker language syntax separates subroutine program segments from main program segments (since the latter occur only once in each code set generated by the linker program and do not vary from projection to projection or equivalently, from cycle to cycle). As the program segment is implemented for each successive slice of a set, the phase encoding list value will therefore remain the same. However, once the program segments are linked together for all slices at a given phase encoding value, a new value is then taken from the cycle-dependent program change table(s) and the main program segments are then implemented again. This process of changing the cycle-dependent parameter values for each implementation of the main program segments is then continued until the specified range of values for the cycle-dependent PCT have all been utilized.

Figure 5:
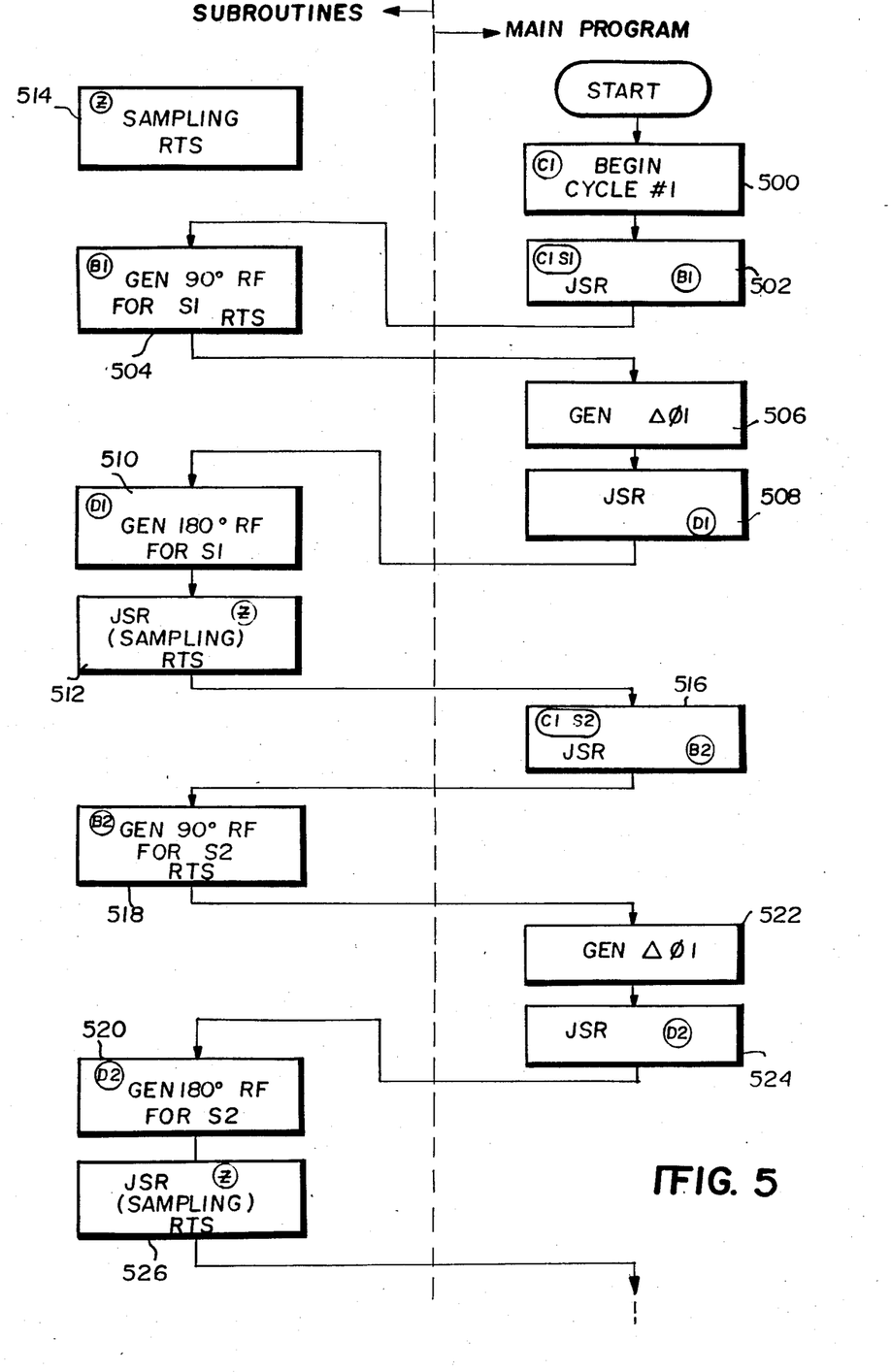
FIG. 5 is a flowchart depiction of machine executable MRI sequence controller instructions assembled in accordance with this invention and divided into assembled and stored main program and subroutine program instruction segments.

The segregation of program segments into subroutines and main program segments is depicted at FIG. 5. In FIG. 5, symbolic addresses have been designated by encirclement so as to facilitate the following discussion. It should be observed that slice-specific main program segments and slice-specific subroutines have been assigned symbolic addresses which begin with alphabetic symbols A-W and that non-slice-specific program segments (which must be referenced by slice-specific program segments) have been assigned symbolic addresses which begin with alphabetic symbols X, Y or Z. Non-slice-dependent main and subroutine program segments may utilize symbols beginning with A-W if they are not referenced by slice-dependent subroutines or main program segments. As will be seen, this distinction permits the linker to replicate slice-specific program segments using indexed symbolic addresses while selectively not replicating other segments—nor indexing the symbolic addresses associated therewith.

The beginning of cycle number 1 at block 500 is assigned a symbolic address C1. Initial non-slice-specific program segments in the main program may then be performed at 502 before jumping to a slice-specific subroutine at symbolic address B1 at block 504. Return is then made to the main program at block 506 where cycle-dependent and perhaps other non-slice-specific program segments are performed. Subsequently, at block 508, a jump is made to another slice-specific subroutine at symbolic address D1 (block 510). At any point in the main program or in any subroutine, a jump may be made as depicted at block 512 to a "true" subroutine at a fixed symbolic address Z (as depicted at block 514). It will be observed that such subroutines are neither slice-specific nor cycle-specific and thus they may be stored a single time as a single subroutine and entered conventionally from any point in the main program or any other subroutine. However, when cycle 1 is continued in the main program at block 516 for the second slice, one cannot merely go back and re-execute the slice-specific subroutines at symbolic addresses B1, D1, etc., because they include slice-specific parameters associated only with the first slice of a multi-slice sequence. Accordingly, the slice-specific parameters of these subroutines must be altered before they are replicated with indexed symbolic addresses as subroutines B2, D2, etc., as depicted in FIG. 5 at blocks 518 and 520. As also depicted in FIG. 5, the non-slice-specific (but possibly cycle-specific) instructions included in the sequence associated with the second slice are replicated at 522 and 524. However, it will be noted that the main program segments replicated at blocks 516 and 524 for the second slice include indexed symbolic address arguments for the jump to subroutine instructions thus causing them to jump to the appropriate slice-specific subroutine at block 518 and 520, etc. As should be appreciated, the usual jump to a fixed symbolic address subroutine Z may be made again at block 526 (or any other place that is desired in the main program or subroutines) without any indexing of associated symbolic addresses.

In general, it will be noted that slice-specific program segments may be replicated by: (a) changing slice-specific parameter values as may be required so as to address different specific slices, and (b) appropriately indexing the symbolic address argument associated with jump to subroutine or jump instructions as well as the symbolic address(es) of the associated slice-specific program segments so as to insure that jumps to a slice-specific subroutine from the main program go to the appropriate slice-specific subroutine and that jumps to subroutine and jump instructions within slice specific subroutines or main program segments go to the appropriate slice specific indexed symbolic location. At the same time, there are other program segments (e.g., those associated with sampling) which do not include slice-specific or cycle-specific parameter values and which may therefore be treated as true conventional subroutines which are not replicated but which are simply stored once at a predetermined place in memory and accessed by a fixed symbolic address at any point in the program. In the exemplary embodiment, true conventional subroutines of this type are assigned predetermined symbolic addresses if they are referenced by slice-dependent program segments (e.g., starting with characters X, Y or Z). Accordingly, during execution of the linker program, any encountered subroutines having these predetermined symbolic addresses are treated as true subroutines which are not replicated and whose symbolic addresses are not indexed.

On the other hand, all program segments designated as being "slice-specific" are replicated in a predetermined order (as specified by the input Linker control statement) while indexing the corresponding symbolic addresses associated with the replicated program segments and also indexing the appropriate referenced table entries in a predetermined sequence so as to maintain proper correspondence between slice-specific main programs and subroutines in each replicated segment.

Figure 6A:
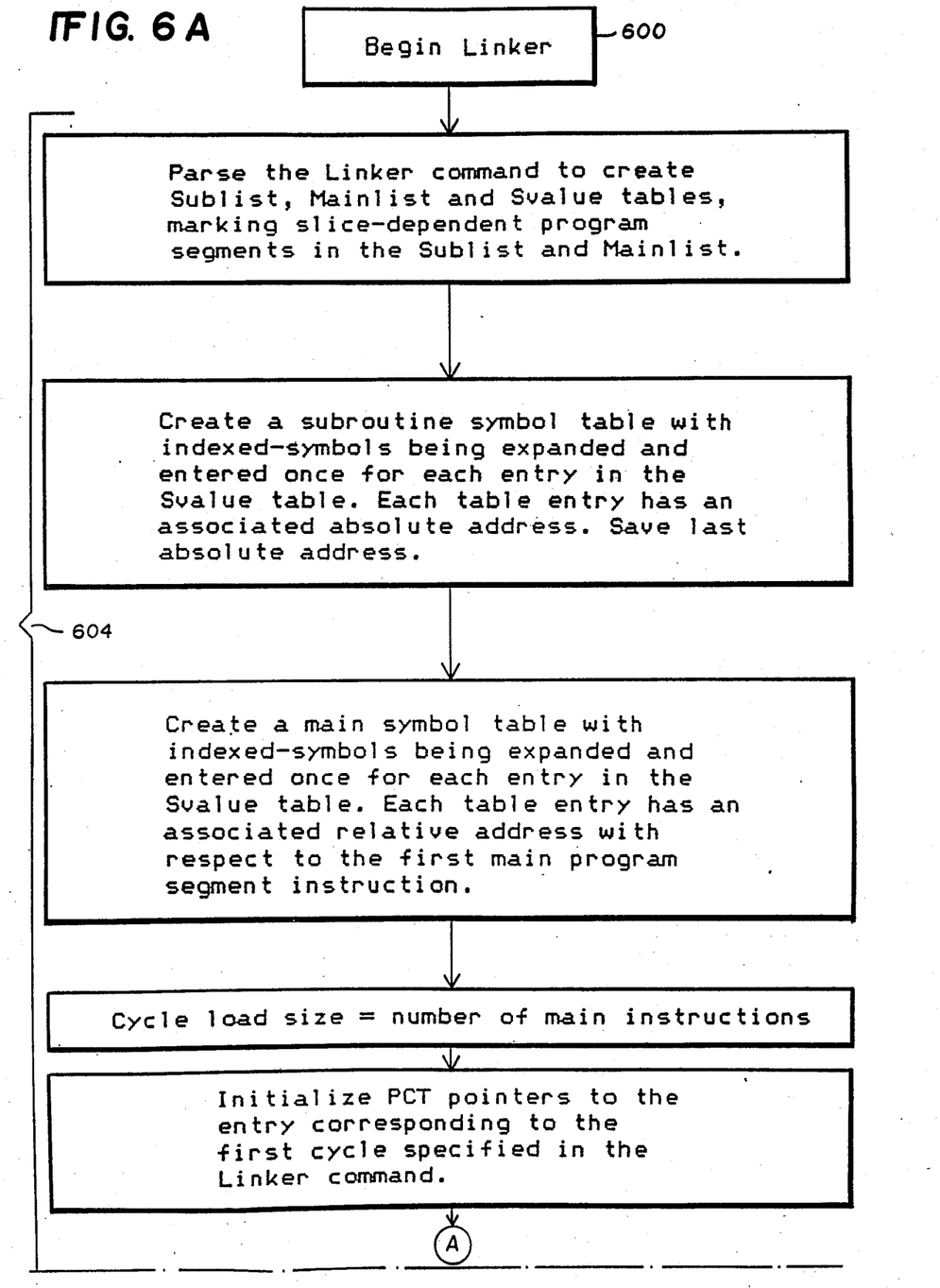
FIGS. 6A-6C are an abbreviated flowchart depiction of the assembler/linker program utilized in an exemplary embodiment of this invention.
Figure 6B:
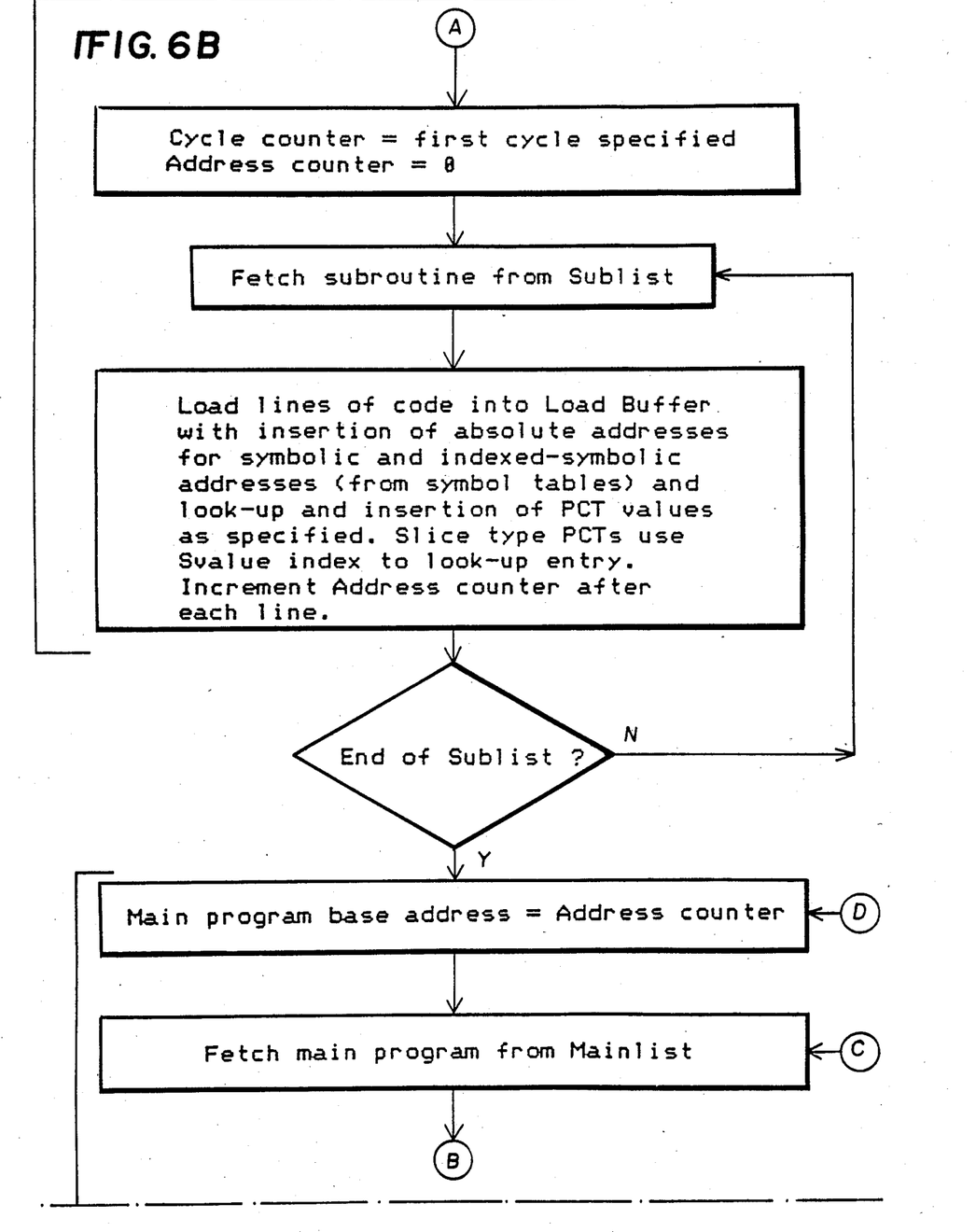
Figure 6C:
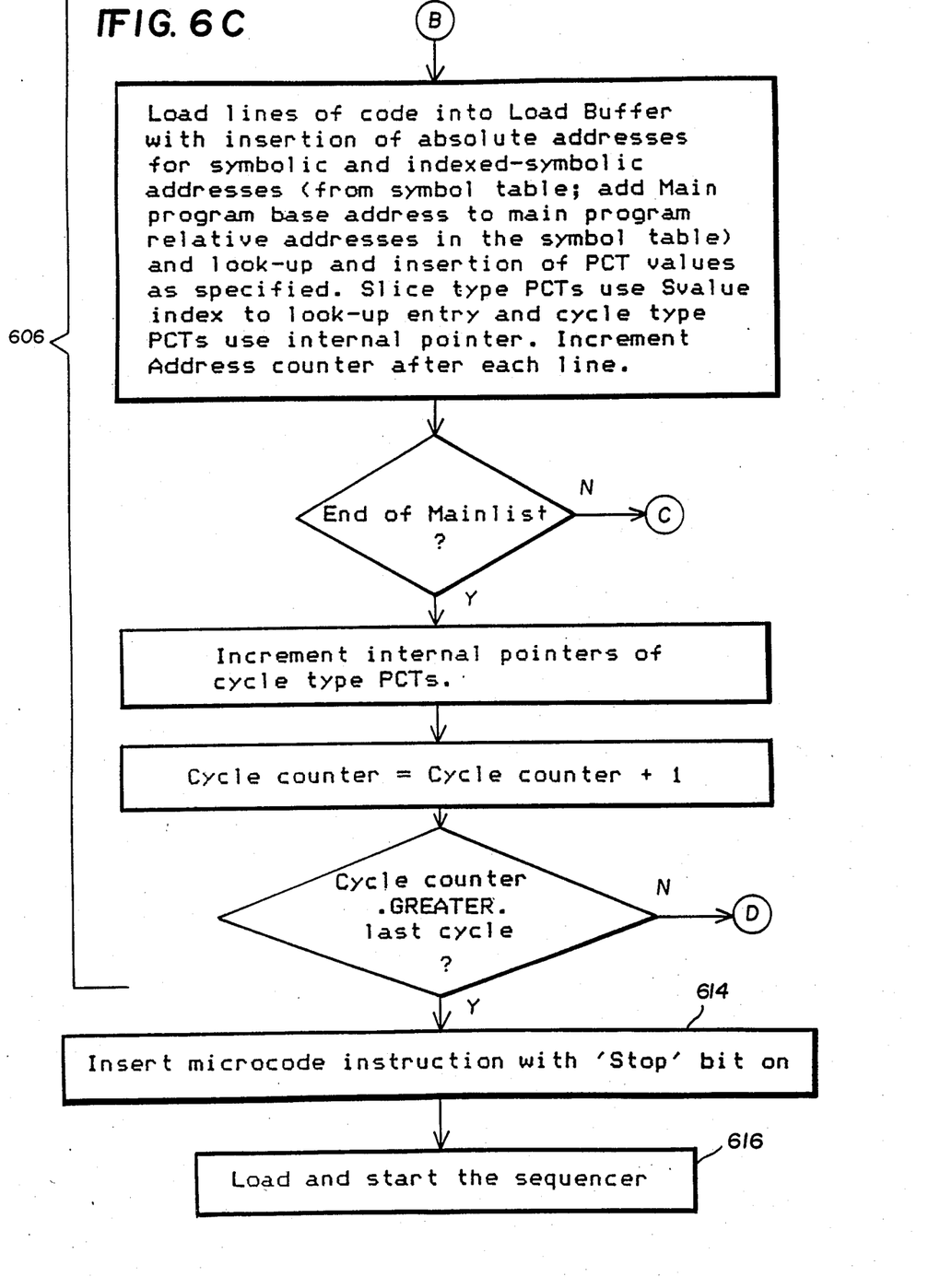

As will be appreciated by those in the art, the program change tables T1, T2, . . . Tn of MRI parameter values will be stored in a machine accessible memory (e.g., RAM) as will the predetermined slice-specific program segments P1, P2, . . . Pm of machine executable MRI sequencer instructions (including pointer-references to the stored tables of parameter values). The actual machine replication of a predetermined set of such slice-specific program segments in a predetermined order, etc., is achieved by another computer program which is commonly called a linker/loader. Since such programs are in general known, only the unique aspects of the exemplary Linker program are depicted in the abbreviated flowchart of FIGS. 6A–6C.

After entering the Linker program at 600 (where a cycle counter may be set to a content of 1), the slice-specific subroutines are expanded at 604 by (a) replicating slice-specific segments appearing within parenthesis in indicated order using indexed symbolic addresses and indexed parameters from the referenced program change tables, and (b) not replicating subroutine segments not within the parentheses of the slice-dependent portion of the linker statement and also not indexing certain symbolic addresses associated with this subset of subroutines (e.g., those having symbolic addresses beginning with the character X, Y or Z). In addition, the Linker of FIGS. 6A–6C expands slice-specific main program segments appearing within parenthesis at 606 in the indicated order (e.g., as indicated in the syntax of the data string used to control the linker as described below) using indexed symbolic addresses and indexed parameters from referenced program change tables except for the predetermined subset of non-slice-specific subroutine segment references which are treated as true and conventional subroutines without indexed symbolic addresses. Any other program segments designated in the input Linker controlling statement or data string are also appropriately linked before the cycle counter is tested and, unless the last cycle has been linked, the cycle counter is incremented and the main program base location updated and control is passed back to the beginning of routine 606. Once microcode for the last cycle of operation has been properly linked, then control is passed to block 614 where a final line of microcode is generated including a "stop" code and exit is taken from the Linker program at block 616 (whereupon the generated microcode may be loaded and executed if desired).

A typical 20 slice imaging sequence for 256 values of phase encoding is written in an exemplary Linker syntax as follows:

P3(P4:6)S20P7/P10(P14)S10:29P15P16;C1:256;L1

The program segments are denoted as "Pn", with those program segments to the left of the "/" being subroutines which are only implemented once for each set of linked microcode. Program segments grouped inside parentheses, "()", are slice-specific and the index used for PCT access is given a range of 20 by the notation "S20" following the subroutine group. (The set of indices used in the main program is also specified as integer values from 10 to 29 by the notation "S10:29" following the main program segment grouping.) If no slice-specific subroutines were present, the number of slices would be determined from "S10:29".

A copy of each subroutine in the slice-specific group is implemented for each slice index value, with symbolic addresses modified to include the index value in each case. Since the symbolic line addresses occurring in slice-specific main program segments are also modified in this way as they are implemented, subroutine calls from main program segments are directed to the properly matching subroutines.

Program segments not included in slice-specific groups retain unmodified symbolic line addresses. Thus, jumps and subroutine calls do not generally cross the boundary between slice-specific and non-slice-specific program segments. The flow of microcode execution between different sets of program segments occurs by way of "Continue" instructions which simply cause the execution of the next sequential microcode instruction. In the case where it is desirable to cross the boundary between different types of program segments as when the code in subroutine segment P7 is called from P4 in the example above, a special class of symbolic addresses is used (e.g., those beginning with X, Y or Z). This class is not modified—even when found in a slice-specific type group—and this allows address resolution to occur in such a way that all slice-specific implementations may call the same subroutine.

The program segment portion of the Linker input command is terminated with a semi-colon, ";". The next set of symbols, preceded by "C", specifies the range of index values to be used for phase encoding or cycle-specific program change tables. In the example above, these lists (i.e., PCTs) are accessed for integer index values from 1 to 256. Once the subroutine program segments have been implemented, the main program segments are implemented once for each phase encoding or cycle-dependent index value, with no modification of symbolic addresses needed. Again the slice-specific program segments (those inside parentheses, "()") are implemented for each slice index value, with the modified symbolic addresses. If a different group of 20 slices had been specified by using S1:20 instead of S10:29, the indexing of symbolic addresses would be similar but table values would be used from table entries 1 to 20.

The last part of each Linker input command follows the final semi-colon, and is preceded by an "L". The single integer value after the "L" indicates the "level" of the linker command, which may be from 1 to 10. Each level allows the association of a set of PCTs with the program segments in the Linker command. The PCTs or lists, realized as Parameter or Program Change Tables in the Assembler, are specified to be at a given "level" for each microcode field having a PCT associated with it. If there is no PCT specified for a level higher than the level(s) associated with a microcode field, the level 1 PCT is defaulted to.

An example of the use of program segment subgroups within a slice-specific grouping, as is used for inversion recovery sequences, is as follows:

P2((P3)R3P4(P5)R3)S6/P10(P11)S6:11P12;C1:128;-L2

The segments in subgroups within parentheses and followed by an "Rn" are repeated as a unit for three slice index values before the following program segment is implemented. The range of slice-specific indices is 6 to 11, so P3 in the example would be implemented for value, 6, 7 and 8 before P4 was implemented for value 6. Similarly, P5 would be implemented for the index values 6, 7 and 8, and then P3 would be implemented again for 9, 10 and 11 and so on. The final result could be shown in a table as follows for one phase-encoding or cycle-specific index value:

TABLE II

| Slice-specific index value | Program segment |
|---|---|
| | Subroutine segments |
| 6 | P3 |
| 7 | P3 |
| 8 | P3 |
| 6 | P4 |
| 6 | P5 |
| 7 | P5 |
| 8 | P5 |
| 9 | P3 |
| 10 | P3 |
| 11 | P3 |
| 9 | P4 |
| 9 | P5 |
| 10 | P5 |
| 11 | P5 |
| | Main segments |
| — | P10 |
| 6 | P11 |
| 7 | P11 |
| 8 | P11 |
| 9 | P11 |
| 10 | P11 |
| 11 | P11 |

In the exemplary emodiment, the linker programs and the resulting microcode are run on conventional PDP-11 hardware and the software is written in LSI-11 assembly language.

While only one examplary embodiment of this invention has been described in detail, those in the art will appreciate that variations and modifications may be made in this example while yet retaining many of the novel features and advantages of this invention. Accordingly, all such variations and modifications are to be included within the scope of the appended claims.

What is claimed is:

1. A process of machine generating machine executable state-change instructions for a sequence controller of a multi-slice magnetic resonance imaging (MRI) system, said process comprising the steps of:
    defining predetermined program-change tables T1, T2, . . . Tn of MRI parameter values in a machine accessible memory;
    defining predetermined slice-specific program segments P1, P2, . . . Pm of machine executable MRI sequencer instructions in a machine accessible memory, which segments are referenced by predetermined respective symbolic addresses and which segments include pointer-references to said tables; and
    machine replicating a predetermined set of said slice-specific program segments in a predetermined order while indexing the corresponding symbolic addresses and referenced table entries in a predetermined sequence so as to maintain proper correspondence between slice-specific main programs and subroutines in each replicated segment.

2. A process as in claim 1 wherein said machine replicating step includes:
    replicating included program segments without indexing predetermined symbolic address(es) thereof.

3. A process as in claim 2 wherein said machine replicating step is controlled by an ordered string of input digital data of the following format:

P3(P4:6)S20P7/P10(P14)S1:20P15P16;C1:256 wherein
    Pn=symbols representing predetermined program segments;
    /=symbol representing a separation between subroutines and main programs;
    (x)Sy=slice-specific designation symbols identifying slice specific program segments x to be replicated for slices y;
    ;=a symbol representing a separation between the main program segments and cycle specification; and
    C1:256=symbols associated with an entire sequence of program segments to be replicated which specifies the range of successive phase-encoding cycles.

4. A process as in claim 3 wherein said ordered string of input digital data includes a further symbol (Rq) designating a subset of slice-specific program segments to be replicated as a unit q times before the following program segment is utilized.

5. A process as in claim 1 wherein said machine replicating step is controlled by an ordered string of input digital data of the following format:

P3(P4:6)S20P7/P10(P14)S1:20P15P16;C1:256 wherein
    Pn=symbols representing predetermined program segments;
    /=symbol representing a separation between subroutines and main programs;
    (x)Sy=slice-specific designation symbols identifying slice specific program segments x to be replicated for slices y;
    ;=a symbol representing a separation between the designated main program segments and cycle specification; and
    C1:256=symbols associated with an entire sequence of program segments to be replicated which specifies the range of successive phase-encoding cycles.

6. A process as in claim 5 wherein said ordered string of input digital data includes a further symbol (Rq) designating a subset of slice-specific program segments to be replicated as a unit q times before the following program segment is utilized.

* * * * *